United States Patent
Hayashi et al.

(10) Patent No.: US 10,000,386 B2
(45) Date of Patent: Jun. 19, 2018

(54) METHOD FOR FORMING OF SILICEOUS FILM AND SILICEOUS FILM FORMED USING SAME

(71) Applicant: AZ ELECTRONIC MATERIALS MANUFACTURING (JAPAN) KK, Tokyo (JP)

(72) Inventors: Masanobu Hayashi, Shizuoka (JP); Tatsuro Nagahara, Shizuoka (JP)

(73) Assignee: AZ Electronic Materials (Luxembourg) S.à.r.l., Luxembourg (LU)

(*) Notice: Subject to any disclaimer, the term of this patent is extended or adjusted under 35 U.S.C. 154(b) by 0 days. days.

(21) Appl. No.: 14/440,773

(22) PCT Filed: Nov. 15, 2013

(86) PCT No.: PCT/JP2013/080886
§ 371 (c)(1),
(2) Date: May 5, 2015

(87) PCT Pub. No.: WO2014/080841
PCT Pub. Date: May 30, 2014

(65) Prior Publication Data
US 2015/0298980 A1    Oct. 22, 2015

(30) Foreign Application Priority Data

Nov. 22, 2012 (JP) .................. 2012-256062

(51) Int. Cl.
| | |
|---|---|
| *B05D 3/00* | (2006.01) |
| *C01B 33/12* | (2006.01) |
| *H01L 21/02* | (2006.01) |
| *H01L 21/311* | (2006.01) |

(52) U.S. Cl.
CPC .............. *C01B 33/12* (2013.01); *B05D 3/007* (2013.01); *H01L 21/02164* (2013.01); *H01L 21/02216* (2013.01); *H01L 21/02222* (2013.01); *H01L 21/02282* (2013.01); *H01L 21/02326* (2013.01); *H01L 21/02337* (2013.01); *H01L 21/31111* (2013.01)

(58) Field of Classification Search
CPC ........ B05D 3/007; B05D 3/0254; B05D 3/04; B05D 3/0453; B05D 3/0466
See application file for complete search history.

(56) References Cited

U.S. PATENT DOCUMENTS

| | | | |
|---|---|---|---|
| 5,922,411 A | 7/1999 | Shimizu et al. | |
| 6,191,022 B1 | 2/2001 | Kenichi Koyanagi | |
| 6,767,641 B1 | 7/2004 | Shimizu et al. | |
| 8,889,229 B2 | 11/2014 | Nagahara et al. | |
| 2004/0194511 A1* | 10/2004 | Cheng | C03B 19/12 65/395 |
| 2005/0008768 A1* | 1/2005 | Onishi | G02B 5/1847 427/66 |
| 2006/0211268 A1 | 9/2006 | Hishiya | |
| 2007/0212894 A1 | 9/2007 | Nakazawa | |

FOREIGN PATENT DOCUMENTS

| | | | |
|---|---|---|---|
| JP | 1-132128 | A | 5/1989 |
| JP | 9-183663 | A | 7/1997 |
| JP | 3178412 | B2 | 4/2001 |
| JP | 2001-308090 | A | 11/2001 |
| JP | 2004-327793 | A | 11/2004 |
| JP | 2007-242956 | A | 9/2007 |
| JP | 2009-206440 | A | 9/2009 |

OTHER PUBLICATIONS

Machine Language English Abstract from JPO of JP 1-132128 A.

* cited by examiner

*Primary Examiner* — Nathan H Empie
(74) *Attorney, Agent, or Firm* — Mitchell Brustein

(57) ABSTRACT

A siliceous film having high purity and a low etching rate is formed by (a) a step for forming a siliceous film on a substrate by coating a solution composed of a polysilazane, e.g., perhydropolysilazane on a substrate and then hardening (curing) the solution in an oxidizing atmosphere, or by coating a silica solution formed by a sol-gel method on a substrate, and (b) a step for heating the siliceous film in an inert gas environment containing a nitrogen-containing compound such as an alkylamine having a base dissociation constant (pKb) no greater than 4.5, or a halogen-containing compound in which the bond energy of a halogen atom such as $F_2$, $Br_2$, or $NF_3$ is no greater than 60 kcal/mol, in order to anneal the film.

4 Claims, No Drawings

METHOD FOR FORMING OF SILICEOUS FILM AND SILICEOUS FILM FORMED USING SAME

This application is a United States National Stage Patent Application under 35 U.S.C. § 371 of International Patent Application No. PCT/JP2013/080886, filed Nov. 15, 2013, which claims priority to Japanese Patent Application No. 2012-256062, filed Nov. 22, 2012, the contents of which are being hereby incorporated herein by reference.

FIELD OF THE INVENTION

The present invention relates to a method for forming a siliceous film and a siliceous film free from impurities with an improved etching rate, which is formed by this method. More specifically, the present invention relates to a method for forming a siliceous film used for forming a semiconductor device, an element separating film such as an STI (Shallow Trench Isolation) for a large scale integrated circuit etc., an insulation film, for example, PMD, and the like; and a siliceous film formed by the method.

BACKGROUND ART

As the siliceous film has a highly heat resistance, a good abrasion resistance, an excellent corrosion resistance, etc., it has been widely used for a long time as an insulation film provided between a semiconductor substrate and a wiring metal layer, between wiring metal layers or on various elements on the semiconductor substrate, an element separating film between various elements provided on the semiconductor substrate, a passivation film, a protective film, a planarization film, a stress adjusting film, a sacrifice film, and the like in the semiconductor device; and an insulation film provide between a glass substrate and an ITO film, between a transparent electrode film and an alignment film, and the like, a protection film provided on a pixel electrode, or a color filter in a liquid crystal display device. The siliceous coating film used in these fields was generally formed on a substrate by a vapor phase growth method such as a CVD method and a spattering method or an application method using a coating liquid for forming a siliceous film. Of these methods, the application method has been widely used in recent years because the vapor phase growth method has problems such that it takes time and needs a large facility and a flat surface cannot be formed on an uneven surface when a coating film is formed on the uneven surface.

By the way, in the field of the electronic devices such as a semiconductor device, higher density and higher integration thereof have been advanced in recent years. To meet these higher density and higher integration, a trench isolation structure, which is prepared by forming a fine trench on a surface of the semiconductor substrate and filling an insulator in the trench to electrically isolate between elements formed on the opposite sides of the trench, is adopted When the aforementioned element separating films having a trench isolation structure are formed by a CVD method, a high density plasma CVD method, etc., a void may be formed in a fine groove. In addition, a method in which an alkoxysilane solution prepared by using a sol-gel method is applied on a substrate and then the coating film formed is converted into silicon dioxide by a heat treatment is considered (for example, see Patent document 1 below). However, in this method, cracks could occur by occurrence of volumetric shrinkage when alkoxysiloxane was converted into silicon dioxide.

As a method for suppressing occurrence of cracks described above, it was proposed to use a polysilazane as a precursor of silica (silicon dioxide; $SiO_2$) (for example, see Patent documents 1 and 2 below) and this method is widely used now. As a composition containing a polysilazane has good burying properties in a trench isolation structure, there is an advantage that voids do not easily generate. For example, when a polysilazane such as perhydropolysilazane are buried in a trench and processed in an oxidation atmosphere, it is known that a siliceous film with high purity and high density is formed. However, a baking step at a high temperature which is generally called annealing is added in forming a siliceous film. At this time, the annealing is performed in a nitrogen or oxygen atmosphere but there exist problems that a film with sufficiently high density is not formed and the etching rare of the film formed becomes fast. It is necessary to control the thickness of the buried silica film by etching but at this time, when the etching rate is fast, an error to the target film thickness becomes easily large. It is, therefore, desirable that the silica film after annealing has a late etching rate. It is possible to make the etching rate lower by the high temperature annealing in a water vapor atmosphere but there occurs a problem that materials other than the siliceous film, no oxidation of which is desired, are oxidized too. In addition, it has been known that the surface of the silicon wafer is oxidized under a water vapor atmosphere or oxygen atmosphere of 400° C. or more and the increase of the film thickness by oxidation is produced. For example, in the production of a flash memory etc., it is necessary to keep the temperature of a water vapor or oxidation atmosphere 400° C. or less for avoiding irregularity of the height on the top surface of the silicon substrate due to the increase of the film thickness. Therefore, the water vapor processing and oxidation processing at a high temperature have not been acceptable in the technical field of manufacturing a semiconductor. Furthermore, it is necessary that STM and PDM formed from perhydropolysilazane is a high purity $SiO_2$ film. The reason is that if impurities such as metal, carbon etc. left in the film, the device properties are badly affected.

The formation of a siliceous film in a trench by the application method are not limited to the method using a polysilazane described above. It has been performed by a suitable method, for example, such as a method using a silica solution prepared by a sol-gel method. However, in this method, it is also required to make the etching rate slow, as the etching rate becomes fast after annealing in an inert gas atmosphere as with a polysilazane. The specific explanation about the element isolation film (STI) has been performed hitherto, but the requirement of improving the etching rate of the siliceous film is same in the formation of an insulation film such as an interlayer insulation film (PMD), a passivation film, a protective film, and a planarization film.

CITATION LIST

Patent document 1: JP 3178412 B
Patent document 2: JP 2001-308090 A

SUMMARY OF THE INVENTION

Problems to be Solved by the Invention

The present invention has been made based on the circumstances described above and an object of the present invention is to provide a method wherein a highly pure siliceous film having the same properties such as good insulation properties, good film planarization properties, good resistant properties for an acid, an alkali, a solvent, and so on, and high barrier properties etc. as before can be formed by annealing a film where a polysilazane was converted into a siliceous film or a coating film formed by a silica solution prepared by a sol-gel method and the siliceous film after annealing has a later etching rate than before.

Another object of the present invention is to provide a method for forming an element separating film with a trench isolation structure, which is formed by the method described above. Furthermore, another object of the present invention is to provide a highly pure siliceous film with a late etching rate, which is formed by the method described above.

Means for Solving the Problems

As a result of intensive studies and investigations, the present inventors found that the problems described above can be solved by annealing a siliceous film, which is formed by applying a polysilazane solution on a substrate and then converting the polysilazane into silica by annealing in an oxidation atmosphere or applying a silica solution prepared by a sol-gel method on a substrate, in the presence of a particular nitrogen-containing compound or a particular halogen-containing compound in an inert gas atmosphere such as in a nitrogen gas atmosphere, that is, a siliceous film with a later etching rate than that of a siliceous film obtained by annealing in an inert gas atmosphere not containing the aforementioned nitrogen-containing compound or halogen-containing compound can be formed. The present invention was accomplished based on these findings.

The present invention, therefore, relates to a method for forming a siliceous film by using a polysilazane resin or a silica solution by a sol-gel method and a siliceous film formed by the method, described below.

(1) A method for forming a siliceous film comprising the steps of
(a) forming a siliceous film on a substrate by applying a polysilazane solution on the substrate and curing it in an oxidation atmosphere or by applying a silica solution prepared by a sol-gel method, and
(b) heating and annealing the siliceous film in an inert atmosphere containing a nitrogen-containing compound having the base dissociation constant (pKb) of 4.5 or less or a halogen-containing compound having the binding energy of a halogen atom of 60 kcal/mol or less.

(2) The method for forming a siliceous film described in (1) above, wherein the nitrogen-containing compound having the base dissociation constant (pKb) of 4.5 or less is amities represented by the formula (II):

wherein $R^4$ represents an alkyl group which may be branched, an alkenyl group, a cycloalkyl group or an aryl group, and $R^5$ and $R^6$ each independently represents a hydrogen atom, an alkyl group which may be branched, an alkenyl group, a cycloalkyl group or an aryl group,
DBU (1,8-diazabicyclo[5,4,0]undecene) or DBN (1,5-diazabicyclo[4,3,0]5-nonene).

(3) The method for forming a siliceous film described in (2) above, wherein the annealing is performed at 400 to 1,200° C. in a dry atmosphere.

(4) The method for forming a siliceous film described in (1) above, wherein the halogen-containing compound is $Br_2$, $F_2$ or $NF_3$.

(5) The method for forming a siliceous film described in (4) above, wherein the annealing is performed at 200 to 500° C. in a dry atmosphere.

(6) The method for forming a siliceous film described in any one of (1) to (5) above, wherein the polysilazane is perhydropolysilazane and the cure is performed at 200 to 500° C. in a water vapor atmosphere.

(7) A method for forming a trench isolation structure, wherein a substrate has a groove for forming a trench isolation structure and the groove is buried and sealed by the method for forming a siliceous film described in any one of (1) or (6) above.

(8) A siliceous film which is formed by the method for forming a siliceous film described in any one of (1) to (6) above.

Advantageous Effect of the Invention

A highly pure siliceous film with a late etching rate can be formed by the method for forming a siliceous film of the present invention without changing the steps and conditions in the previous application method. Accordingly, etching of an insulation film such as a highly pure siliceous film in a trench or a highly pure interlayer insulation film, a passivation film, a protective film, a planarization film, etc. are performed precisely and properly.

MODE FOR CARRYING OUT THE INVENTION

The present invention will be explained below in more detail. In the present invention, first, a siliceous film is formed by (i) applying a polysilazane solution on a substrate and baking it or (ii) applying a silica solution prepared by a sol-gel method.

The polysilazane used in the present invention may be a polysilazane containing at least a Si—H bond and an N—H bond in the molecule or modified products thereof. As the polysilazane, there exist polysilazanes having a linear, cyclic or cross-linking structure or having a plurality of these structures. These may be used singly or combinedly. Typical examples thereof include a polysilazane having a number-average molecular weight of about 100 to about 50,000, which has a structural unit represented by the following formula (I), and modified products thereof.

Wherein $R^1$; $R^2$, and, $R^3$ each independently represents a hydrogen atom, an alkyl group, an alkenyl group, a cycloalkyl group, an aryl group, or a group having a carbon atom directly binding to the silicon atom such as fluoroalkyl group except for the aforementioned groups, an alkylsilyl group, an alkylamino group or an alkoxy group. But, at least one of $R^1$, $R^2$, and, $R^3$ is a hydrogen atom.

A polysilazane wherein all of $R^1$, $R^2$, and, $R^3$ in the formula (I) are a hydrogen atom is perhydropolysilazane. The production methods thereof are described in JP 60-145903 A and D. Seyferth et al., Communication of Am. Cer. Soc., C-13, January 1983. The polysilazane obtained these production methods is a mixture of polymers having various constructions. It, however, contains a chain part and a cyclic part and can be represented by the following chemical formulae. In the present invention, perhydropolysilazane is preferably used, as the end product needs to be silica.

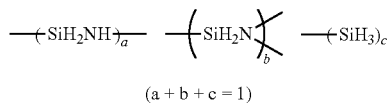

(a + b + c = 1)

An example of the structure of perhydropolysilazane is shown below.

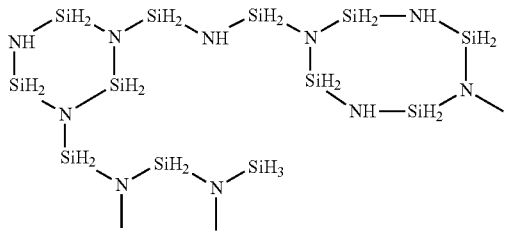

The production method of a polysilazane represented by the formula (1) in which $R^1$ and $R^2$ are a hydrogen atom and $R^3$ is a methyl group is disclosed in D. Seyferth et al., Polym. Prepr. Am. Chem. Soc., Div. Polym. Chem., 25, 10 (1984). The polysilazane obtained by this method contains a chain polymer with a repeating unit of —(SiH$_2$NH$_3$)— and a cyclic polymer and has no cross-linking structure.

Production methods of a polyorgano(hydro)silazane represented by the formula (I) in which $R^1$ and $R^3$ are a hydrogen atom and $R^2$ is an organic group is disclosed in D. Seyferth et al., Polym. Prepr. Am. Chem. Soc., Div. Polym. Chem., 25, 10 (1984) and JP 61-89230 A. The polysilazanes prepared by these methods include a polysilazane having a repeating unit of —(R$^2$SiHNH)— and a cyclic structure with a polymerization degree of 3 to 5 mainly and a polysilazane represented by the chemical formula of (R$^3$SiHNH)$_x$ [(R$^2$SiH)$_{1.5}$N]$_{1-x}$(0.4<X<1), which has a chain structure and a cyclic structure in the molecule.

A polysilazane represented by the formula (I) wherein $R^1$ is a hydrogen atom and $R^2$ and $R^3$ are an organic group and a polysilazane represented by the formula (I) wherein $R^1$ and $R^2$ are an organic group and $R^3$ is a hydrogen atom have a repeating unit of —(R$^1$R$^2$SiNR$^3$)— and a cyclic structure with a polymerization degree of 3 to 5 mainly.

Examples of the polysilazane except for the polysilazane represented by the formula (I) include, for example, a polysilazane represented by the following structure. See D. Seyferth et al., Communication of Am. Cer. Soc. C-132, July 1984.

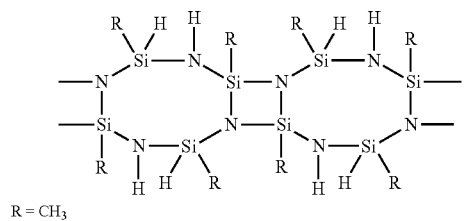

R = CH$_3$

The polysilazane may be a polysilazane: $R^1Si(NH)_x$, having a cross-linked structure, which is obtained by an ammonia decomposition of $R^1SiX_3$ (wherein X is a halogen atom) or a polysilazane having the following structure obtained by a co-ammonia decomposition of $R^1SiX_3$ and $R^2{}_2SiX_2$ as described in JP 49-69717 A.

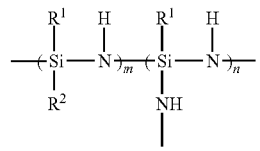

Wherein m and n are a positive integer.

As a method of synthesizing a polysilazane, JP 63-16325 B discloses a method in which adducts of dihalosilane with a base are reacted with ammonia. In addition to this, various other methods have been proposed for synthesizing a polysilazane, for example, (a) a method in which a silicon halide such as SiCl$_4$ or SiH$_2$Cl$_2$ is reacted with an amine, (b) a method in which of a polysilazane is produced from a silazane by use of a dehydrogenating catalyst consisting of an alkali metal hydride such as KH, (c) a method in which a silazane is synthesized by the dehydrogenation reaction of a silane compound and an amine compound by use of a transition metal complex catalyst, (d) a method in which an amine exchange of aminosilane with ammonia by use of an acid catalyst such as CF$_4$SO$_3$H is performed, (e) a method in which an amine exchange of an aminosilane with a large amount of ammonia or amine is performed, (f) a method in which an amine exchange reaction of a polyvalent aminosilane with a polyhydrogenated nitrogen-containing compound is performed in the presence of a basic catalyst, etc. See, for example, WO 97/24391 A.

Following is a specific example of a method for preparing a polysilazane composition. That is, dichlorosilane with the purity of 99% or more is added into dehydrated pyridine controlled within a temperature of −20° C. to 20° C. with stilling. The temperature thereof continues to adjust within a temperature of −20° C. to 20° C. and ammonia with the purity of 99% or more is added into the mixture with stirring. At this time, a crude polysilazane and ammonium chloride as a byproduct are produced in the reaction liquid. Ammonium chloride produced by the reaction is removed by filtration. The filtrate obtained is heated to a temperature of 30 to 150° C. to control the average weight molecular weight of the polysilazane within 1,500 to 15,000 while removing remaining ammonia. Organic solvent is added to this and then it is heated to 30 to 150° C. and remaining pyridine is removed by the vacuum distillation at 50 mmHg or lower. At this time, organic solvent is removed together with pyridine to adjust the concentration of polysilazane, for example, 5 to 30 weight-%. The polysilazane composition obtained is circulate-filtered by use of a filter with filtration precision of 0.1 μm or less to reduce coarse particles having a particle size of 0.2 μm or more to 50 pieces/cc or less. The thus obtained polysilazane solution may be used as a coating solution as it is or after dilution or concentration.

Examples of organic solvent usable include: (A) aromatic hydrocarbons such as benzene, toluene, xylene, ethylbenzene, diethylbenzene, trimethylbenzene, triethylbenzene, and decahydronaphthalene; (B) liner saturated hydrocarbons such as n-pentane, i-pentane, n-hexane, i-hexane, n-heptane, i-heptane, n-octane, i-octane, n-nonane, i-nonane, n-decane, and i-decane; (C) cyclic saturated hydrocarbons such as cyclohexane, ethylcyclohexane, methylcyclohexane, and p-menthane; (D) cyclic unsaturated hydrocarbons such as cyclohexene and dipentene (limonene); (E) ethers such as dipropyl ether, dibutyl ether, and anisole; (F) esters such as n-butyl acetate, i-butyl acetate, n-amyl acetate, and i-amyl acetate; (G) ketones such as methyl isobutyl ketone; and so on.

The production method of a polysilazane composition described above indicates only an example and the production method of a polysilazane composition used in the present invention is not limited to the aforementioned method. For example, a solid polysilazane is obtained and dissolved or dispersed in the aforementioned appropriate solvent. The solution or dispersion may be used as a polysilazane composition. Furthermore, commercially available polysilazane compositions such as Spinfil 200, 400, 600, or 65001 manufactured by AZ Electronic Materials Manufacturing K.K. ("Spinfil" is a registered trademark.) may be used. The concentration of the solution can be adjusted appropriately according to the thickness of the finally formed polysilazane coating film.

The content of the polysilazane is preferably 0.1 to 40 weight-%, more preferably 0.2 to 30 weight-%, further more preferably 0.3 to 25 weight-% based on the total weight of the polysilazane coating composition. Further, it is preferable for forming a high purity siliceous film to use no additive, but a silica conversion reaction accelerating compound and the like may be used, if necessary. Here, the silica conversion reaction accelerating compound is a compound accelerating the conversion of a polysilazane into a siliceous material by a mutual reaction with a polysilazane compound.

The polysilazane composition may be applied on a substrate in an optional manner. Specific examples thereof include a spin-coating method, a dipping method, a spraying method, a roller coating method, a transfer method, a slit-coating method, and a curtain coating method. Of these, the spin coating method is specifically preferable from the point of view of the evenness of the coating film surface. The thickness of the coating film can be adjusted to a desired thickness by applying the coating composition once or repeating the application process two or more times as necessary.

The thickness of the coating film differs depending on the purpose of use, but is set to generally 10 to 2,000 nm, preferably 20 to 1,000 nm. When the polysilazane composition is used as an element isolation film, the thickness of the polysilazane coating film formed by application is preferably 10 to 1,000 nm generally, more preferably 50 to 800 nm for achieving both embedding in a trench groove and flatness of the coating film surface after application. The coating condition changes according various conditions such as the size of the substrate, the application method, the concentration of the polysilazane composition, the kind of solvent used, etc. For example, an example of application by spin coating is shown below, but the coating method of the present invention is not limited to the example described below.

First, for example, 0.5 cc to 20 cc of the polysilazane composition per a silicon substrate is dripped to a central portion of the silicon substrate or several places of the silicon substrate including a central portion so as to form a uniform coating film on the whole surface of the substrate. Next, for spreading the dripped polysilazane composition solution over the whole surface, the substrate is spun at a relatively low speed for a short time, for example, at a spin speed of 50 to 500 rpm for 0.5 to 10 seconds (Pre-spin). Then, it is spun at a relatively high speed, for example, at a spin speed of 500 to 4,000 rpm for 0.5 to 800 seconds (Main spin). Further, it is spun at a faster spin speed by 500 rpm or more than the main spin speed, for example, at a spin speed of 1,000 to 5,000 rpm for 5 to 300 seconds for decreasing the swell of the polysilazane coating film, which is formed in the periphery of the silicon substrate, and drying solvent in the polysilazane coating film as much as possible (Final spin).

After applying the polysilazane composition to the substrate, it is preferred to prebake (heat-treat) the coating film, for example, on a hot plate. This step is performed for completely removing solvent contained in the coating film and pre-curing the coating film before the final application step. In the prebaking step, a method of heating the coating film at a substantially fixed temperature under the atmosphere is usually adopted. However, prebaking may be performed while controlling the temperature and increasing the temperature with time for preventing the generation of dent at a recessed part of the substrate by shrinking of the coating film during curing and the occurrence of a void in the groove. The prebaking temperature is usually 50 to 400° C., preferably 100 to 300° C. The prebaking time is usually 10 seconds to 30 minutes, preferably 30 seconds to 10 minutes. When an insulation film having a trench isolation structure is formed, it is preferred to prebake while increasing the temperature with time. At this time, the maximum prebaking temperature is generally set to a higher temperature than the boiling point of solvent used in the polysilazane composition. After prebaked, a treatment liquid containing an oxidation (curing) promoter may be applied over the polysilazane coating film.

The thus formed polysilazane coating film is then cured for converting a polysilazane into a siliceous film. The curing is conducted by a proper method such as a method of heat treating in an inert gas or oxygen atmosphere containing water vapor, a method of heat treating in a water vapor atmosphere containing hydrogen peroxide vapor or the like, by using a curing furnace or a hot plate. The water vapor is an important factor for converting a polysilazane into a siliceous film (that is, silicon dioxide) completely and the concentration thereof is preferably 30% or more, more preferably 50% or more, most preferably 70% or more. Particularly, when the water vapor concentration is 80% or more, the conversion of a polysilazane into a siliceous film becomes easy to proceed, occurrence of defects such as a void is decreased, and properties of the siliceous film are improved. Therefore, the concentration of 80% or more is desirable. When an inert gas is used as the atmospheric gas, nitrogen gas, argon gas, helium gas or the like is usually used as the inert gas. The curing temperature changes depending on the kind of the polysilazane compound used, the concentration of water vapor, etc. However, generally, when the temperature is high, a conversion speed tends to become fast and when the temperature is low, bad influences to the device characteristics depending on oxidation or change of the crystal structure of the silicon substrate tend to become small. In the present invention, the curing may be conducted generally at a temperature of about 200 to 500° C., for example, 350° C., as a high temperature heat treatment is performed in an annealing step which is a post step. Here a temperature rising rate up to a target temperature is made from 0.1 to 100° C./min and the curing time after reaching the target temperature is made generally from one minute to 10 hours, preferably from 15 minutes to 3 hours. The treatment temperature and the composition of the treatment atmosphere may be changed stepwise, if necessary.

In the method of exposing the coating film to hydrogen peroxide vapor, the coating film may be held at a temperature of from 50° C. to 200° C. and placed under the hydrogen peroxide vapor atmosphere at 50 to 200° C. for one minute to two hours. At this time, other vapors such as a water vapor and an inert gas may be contained in the hydrogen peroxide vapor atmosphere. When the concentration of hydrogen peroxide vapor becomes high, the oxidation speed of the coating film becomes fast generally.

On the other hand, the siliceous film may be formed by applying a silica solution prepared by a sol-gel method. As a typical method thereof, there is a method where tetraalkoxysilane represented by the formula: $Si(ORa)_4$ (wherein Ra represents a lower alkyl group) is subjected to the hydrolysis/polycondensation reaction in an organic solvent such as alcohol by use of an acid catalyst such as hydrochloric acid or a base catalyst to separate alcohol. As a result, silica is synthesized. In the formula described above, as Ra, a methyl group, an ethyl group, a n-propyl group, a n-butyl group and the like are used. Specific examples of the tetraalkoxysilane include, for example, tetramethoxysilane: $Si(OCH_3)_4$, tetraethoxysilane: $Si(OC_2H_5)_4$, tetrapropoxysilane: $Si(OC_3H_7)_4$, tetrabutoxysilane: $Si(OC_4H_9)_4$, and so on. As the organic solvent, alcohols such as methyl alcohol, ethyl alcohol, n-propyl alcohol, isopropyl alcohol, and n-butyl alcohol are preferably used. As a specific example of a sol-gel method, there is raised a method for forming a silica solution by mixing TEOS (tetraethyl orthosilicate; tetraethoxysilane), ethyl alcohol, water, and hydrochloric acid.

As the substrate on which a polysilazane solution or a silica solution by a sol-gel method is applied, a semiconductor substrate such as a silicon substrate and a glass substrate are raised, and a trench groove may be formed on the silicon substrate etc. by etching. Furthermore, when an insulation film such as an interlayer insulation film, a planarization film, a passivation film, a stress adjusting film, a sacrifice film, and the like are provided, the silicon substrate on which a semiconductor film or a circuit was provided during the formation of a semiconductor element is used as the substrate.

After forming a siliceous film on the substrate as described above, the whole substrate is subjected to an annealing (quenching) treatment step for completely converting the whole polysilazane coating film into a siliceous film and curing in the present invention. In the annealing treatment, it is common that the whole substrate is put into a curing furnace and the like and heated. At this time, a nitrogen-containing compound having the base dissociation constant (pKb) of 4.5 or less or a halogen-containing compound having the binding energy of a halogen atom of 60 kcal/mol or less is contained in the heating atmosphere in the present invention. When the nitrogen-containing compound or halogen-containing compound is liquid or a solid, it is preferred that the compound is vaporized in a pre-heating furnace to gasify and the gasified compound is supplied with an inert gas to a heating furnace.

Further, in the present invention, the base dissociation constant (pKb) is the dissociation constant for water. The base dissociation constant (pKb) and the binding energy of a halogen atom are already known of a wide variety of compounds.

As the nitrogen-containing compound having the base dissociation constant @Kb) of 4.5 or less, amines represented by the formula (H) below, DBU (1,8-diazabicyclo[5,4,0]7-undecene), DBN (1,5-diazabicyclo[4,3,0]5-nonene) etc. are raised, for example.

$$R^4R^5R^6N \qquad (II)$$

Wherein $R^4$ represents an alkyl group which may be branched, an alkenyl group, a cycloalkyl group or an aryl group, and $R^5$ and $R^6$ each independently represents a hydrogen atom, an alkyl group which may be branched, an alkenyl group, a cycloalkyl group or an aryl group.

Preferred examples of amines represented by the formula (II) include methylamine, dimethylamine, trimethylamine, ethylamine, diethylamine, triethylamine, propylamine, dipropylamine, tripropylamine, butylamine, dibutylamine, tributylamine, pentylamine, dipentylamine, tripentylamine, hexylamine, dihexylamine, trihexylamine, heptylamine, diheptylamine, octylamine, dioctylamine, trioctylamine, phenylamine, diphenylamine, triphenylamine, etc.

On the other hand, as the halogen-containing compounds where a binding energy of a halogen atom is 60 kcal/mol or less, there are raised, for example, $Br_2$, $F_2$, $NF_3$, and so on.

The annealing is conducted under an inert gas atmosphere containing the aforementioned amine- or halogen-containing gas, Nitrogen gas, helium gas, argon gas etc. are usually used as the inert gas. The annealing temperature is usually from 400° C. to 1,200° C., preferably from 450° C. to 1,000° C. when a nitrogen atom-containing compound such as amines, DBU, and DBN is contained. When water vapor is contained in the annealing atmosphere which contains the amine-containing compound, the advantageous effect of the present invention is not obtained. On the other hand, when annealing is performed under the atmosphere containing the halogen atom-containing compound, the annealing is performed at 200° C. to 1,200° C., preferably 200 to 500° C., more preferably 300 to 500° C., under a dry atmosphere. The temperature raising time to the target treatment temperature is preferably set from 1° C./minute to 100° C./minute in general. The treatment time at the target treatment temperature is from 1 minutes to 10 hours, preferably from 15 minutes to 3 hours.

The content of the nitrogen-containing compound having the base dissociation constant (pKb) of 4.5 or less or the halogen-containing compound having the binding energy of a halogen atom of 60 kcal/mol or less may be usually 0.01 volume-% or more, preferably 0.5 to 20 volume-%, further more preferably 1 to 10 volume-%. If the content is too small, the advantageous effect of the present invention may not be shown. On the other hand, if the content of the compound is high, the etching rate tends to become fast usually and if the content becomes excessively high, the advantageous effect of the present invention is reduced.

Dense siliceous film with a high purity and an improved etching rate (low etching rate) can be formed by heating under the inert gas atmosphere containing the nitrogen-containing compound having the base dissociation constant (pKb) of 4.5 or less or the halogen-containing compound having the binding energy of 60 kcal/mol or less. The reason is considered as follows, but the present invention is not limited thereby.

First, the explanation will be performed concerning the case using, for example, the alkylamine. The alkylamine is an electron-donating compound and has a lone pair electron. The lone pair electron of alkylamine reacts with a Si—H bond or a Si—O bond remaining in a siliceous film during annealing. As a result, Si is negatively ionized and N in alkylamine is positively ionized. The negatively ionized Si links with another Si—O molecule to make the Si—O ring large. For example, when a ring consisting of $(Si-O)_3$ becomes large and forms a $(Si-O)_5$ ring, the etching rate becomes slow.

Whereas, if a H₂O molecule exists in the atmosphere, the alkylamine is hydrated. As the hydrated amine is stable, it cannot react with the Si—H bond or the negatively ionized Si recombines with a H₂O molecule immediately. Therefore, the Si—O ring cannot be enlarged.

On the other hand, in the case of the halogen-containing compound, for example, an N—F bond or an F—F bond is cut by heating at 200 to 500° C. and the cut F anion combines with silica temporarily. The thus formed Si—F bond is cut by heating at 500 to 1,200° C. and a Si—O ring can be enlarged by a cross-linking reaction.

EXAMPLES

Hereinafter, the invention will be specifically described with reference to Examples and Comparative examples. However, it should be understood that the present invention is not restricted by these Examples and Comparative examples.

Example 1

About one mL of a perhydropolysilazane 20 weight-% dibutyl ether solution (Spinfil 65001 manufactured by AZ Electronic Materials Manufacturing K.K.,"Spinfil" is a registered trade-mark.) was dripped on a 4-inch silicon wafer and then spin-coated on a silicon wafer at a speed of 1,000 rpm for 20 seconds by a spin coater, followed by soft baking on a hot plate at 150° C. for 3 minutes in the atmosphere. The film thickness was 600 nm. Then, it was treated with 80% water vapor (H₂O is 80% and O₂ is 20%.) at 350° C. for 60 minutes (Baking) to change perhydropolysilazane into a siliceous film (Curing). After that, the temperature was raised to 700° C. while maintaining the N₂ atmosphere and at this temperature, it was treated in a 2% trimethylamine (N₂-diluted) atmosphere for 60 minutes and then processed in an N₂ atmosphere at this temperature. The relative etching rate of the siliceous film obtained was calculated by the following method. The relative etching rate thereof was 4.1.

<Calculation of Relative Etching Rate>

The siliceous film formed was immersed in a 0.5% hydrogen fluoride water solution and then a film thickness change per unit immersion time was observed. Specifically, the film thickness was measured every 5 minutes and the reducing rate of the film thickness as etching progresses were calculated as nm/min. Further, the same processing and calculation were performed with regard to a thermal oxide film and the etching rate thereof was calculated. From etching rates calculated, a ratio of [Etching rate of siliceous film (Unit is nm/min)]/[Etching rate of thermal oxide film (Unit is nm/min)] was calculated and this calculated value is considered to a relative etching rate. As this value indicates the ratio, it is a dimensionless number. The film thickness was measured by a reflecting spectrographic film thickness meter, FE-3000 manufactured by Otsuka Electronics Co., LTD.

In addition, as the standard thermal oxide film above, there was used a film prepared as follows. That is, non-coated silicon wafer is put in the water vapor atmosphere of 1,050° C. for one hour and the surface of silicon was oxidize to form a thermal oxide film having a film thickness of about 500 nm. This thermal oxide film was use too as the standard film in all Examples and Comparative examples below.

Examples 2 and 3

A siliceous film was formed by the same manner as Example 1 except for processing in a 4% trimethylamine (N₂-diluted) atmosphere (Example 2) or a 10% trimethylamine (N₂-diluted) atmosphere (Example 3) instead of processing in a 2% trimethylamine (N₂-diluted) atmosphere. The relative etching rates of the siliceous films obtained were, respectively, 4.6 and 4.8.

Examples 4 to 7

A siliceous film was formed by the same manner as Example 1 except for processing in a 2% dimethylamine (N₂-diluted) atmosphere (Example 4), a 2% monomethylamine (N₂-diluted) atmosphere (Example 5), a 2% triethylamine (N₂-diluted) atmosphere (Example 6), or a 2% DBU (1,8-diazabicyclo[5,4,0]undecene) (N₂-diluted) atmosphere (Example 7) instead of processing in a 2% trimethylamine (N₂-diluted) atmosphere. The relative etching rates of the siliceous films obtained were, respectively, 4.1, 4.2, 4.5 and 4.8. In the processing using triethylamine or DBU, these compounds were vaporized in a pre-heating furnace and the then vaporized gas was introduced into the processing furnace by using N₂ carrier gas.

Comparative Examples 1 and 2

A siliceous film was formed by the same manner as Example 1 except for processing in a N₂ gas atmosphere (Comparative example 1) or a 2% ammonia (N₂-diluted) atmosphere (Comparative example 2) instead of processing in a 2% trimethylamine (N₂-diluted) atmosphere. The relative etching rates of the siliceous films obtained were, respectively, 5.6 and 6.1.

In the examples using perhydropolysilazane, from Comparative examples 1 and 2, the relative etching rates of the siliceous films obtained by annealing in an atmosphere comprising N₂ gas only or in an ammonia atmosphere are 5.6 and 6.1. In contrast, from Examples 1 to 7, the relative etching rates of the siliceous films obtained by annealing in the same condition except for containing trimethylamine, dimethylamine, monomethylamine or DBU are 3.9 to 4.8. From these results, it is understood that the etching rate becomes late by annealing in an atmosphere containing one of these compounds.

The base dissociation constants, pKb of nitrogen-containing compounds used in Examples 1 to 7 are as follows; trimethylamine is 4.13, dimethylamine is 3.26, monomethylamine is 3.36, triethylamine is 3.28, and DBU is 1.5. On the other hand, the base dissociation constant, pKb of ammonia which is a nitrogen-containing compounds used in Comparative example 2 is 4.75. From these, it is understood that when the base dissociation constant, pKb is 4.5 or less, the advantageous effect of the present invention is obtained.

Further, the impurity analysis of the siliceous films obtained by Example 1 and Comparative example 1 was conducted. Both were extremely highly pure siliceous films and the contents of the impurities were almost same.

Furthermore, film properties of the siliceous film formed in Example 1 and the siliceous film obtained in Comparative example 1 were measured. Results are shown in Table 1 below.

TABLE 1

| | Shrinkage percentage* (%) | Stress** (MPa) | Electric characteristics | | |
|---|---|---|---|---|---|
| | | | Dielectric constant | Vfb (V) | Vbd (MV/cm) |
| Example 1 | 15.9 | 144 | 4.84 | −30.6 | 2.4 |
| Comparative example 1 | 14.7 | 186 | 5.28 | −36.4 | 1.3 |

*Shrinkage percentage in the thickness direction of the film thickness after annealing to the film thickness after soft bake.
**A value in plus shows a tensile strength and a value in minus shows a compressive force.
Vfb: A flat band voltage.
Vbd: A withstand voltage (Break Down Voltage).

From Table 1, it is understood that a dense silica film was able to be formed by annealing in an amine atmosphere from the fact that the withstand voltage (Vbd: Break Down Voltage) of Example 1 is higher than that of Comparative example 1 and the dielectric constant of Example 1 is closer that of pure silicon dioxide (about 3.9).

Comparative Examples 3 and 4

A siliceous film was formed by the same manner as Example 1 except for processing in an atmosphere consisting of 40% of water vapor and 60% of $N_2$ gas (Comparative example 3) or an atmosphere consisting of 2% of trimethylamine, 40% of water vapor and 58% of $N_2$ gas (Comparative example 4) instead of processing in a 2% trimethylamine ($N_2$-diluted) atmosphere. The decrease rates of film thickness were measured and the relative etching rates of the siliceous films obtained were, respectively, 5.6 and 6.1.

From the results of Comparative examples 3 and 4, it is understood that an addition effect of amine is lost when the water vapor coexists.

Example 8

8.36 g (0.04 moles) of TEOS (tetraethyl orthosilicate), 11.5 g (0.25 moles) of ethanol, 4.32 g (0.24 moles) of water, and 1 g of 1 mole/L hydrochloric acid water solution were mixed in a plastic vessel at room temperature for one day. After this, the mixed solution was diluted 4 times with ethanol to prepare silica solution by a sol-gel method.

One mL of the thus obtained silica solution was dripped on a 4-inch silicon wafer and spin-coated at 1,500 rpm for 20 seconds by a spin coater, followed by soft baking on a hot plate at 150° C. for 3 minutes in the atmosphere. The film thickness was 100 nm. Then, the temperature was raised to 700° C. while maintaining the $N_2$ atmosphere and it was processed at this temperature for 60 minutes in a 2% trimethylamine ($N_2$-diluted) atmosphere. The relative etching rate of the siliceous film obtained was calculated by the same method as Example 1. The relative etching rate was 7.3.

Comparative Example 5

A siliceous film was formed by the same manner as Example 8 except for processing in a $N_2$ gas atmosphere instead of processing in a 2% trimethylamine ($N_2$-diluted) atmosphere. The relative etching rate of the siliceous film obtained was 11.5.

From Example 8 and Comparative example 5, it is understood that the etching rate becomes late as with the polysilazane, even if a siliceous film is formed by using a silica solution by a sol-gel method.

Example 9

A siliceous film was formed by the same manner as in Example 1 except for raising the temperature to 500° C. instead of raising the temperature to 700° C. and performing the processing in the 2% trimethylamine ($N_2$-diluted) atmosphere at this temperature. The relative etching rate of the siliceous film obtained was 6.4.

Comparative Example 6

A siliceous film was formed by the same manner as Example 9 except for processing in a $N_2$ gas atmosphere instead of processing in a 2% trimethylamine ($N_2$-diluted) atmosphere. The relative etching rate of the siliceous film obtained was 6.9.

From Example 9 and Comparative example 6, it is understood that the advantageous effect of the present invention is obtained even when the annealing temperature is 500° C.

Example 10

3.30 g (0.02 moles) of triethoxysilane, 4.318 g (0.02 moles) of TEOS, 9.2 g (0.2 moles) of ethanol, 3.6 g (0.2 moles) of water, and 0.1 g of 1 mole/L hydrochloric acid water solution were mixed in a plastic vessel at room temperature for one day. After this, the mixed solution was diluted 4 times with ethanol to prepare a silica solution by a sol-gel method.

One mL of the thus obtained silica solution was dripped on a 4-inch silicon wafer and spin-coated at 1,500 rpm for 20 seconds by a spin coater, followed by soft baking on a hot plate at 150° C. for 3 minutes. The film thickness was 100 nm. Then, the temperature was raised to 700° C. while maintaining the $N_2$ atmosphere, and it was processed at this temperature for 60 minutes in a 2% trimethylamine ($N_2$-diluted) atmosphere. The relative etching rate of the siliceous film obtained was calculated by the same method as Example 1. The relative etching rate was 9.3.

Comparative Example 7

A siliceous film was formed by the same manner as in Example 10 except for processing in a $N_2$ gas atmosphere instead of processing in a 2% trimethylamine ($N_2$-diluted) atmosphere. The relative etching rate of the siliceous film obtained was 10.8.

From Example 10 and Comparative example 7, it is understood that the advantageous effect of the present invention is obtained at an annealing temperature of 700° C. even if a silica solution by a sol-gel method is used.

Comparative Example 8

About one mL of a perhydropolysilazane 20 weight-% dibutyl ether solution (Spinfil 65001 manufactured by AZ Electronic Materials Manufacturing K.K., "Spinfil" is a registered trade-mark.) was dripped on a 4-inch silicon wafer and then spin-coated on a silicon wafer at a speed of 1,000 rpm for 20 seconds by a spin coater, followed by soft baking on a hot plate at 150° C. for 3 minutes in the atmosphere. The film thickness was 600 nm. Then, it was processed with 80% water vapor ($H_2O$ is 80% and $O_2$ is 20%.) at 350° C. for 60 minutes (Baking) to change perhydropolysilazane into a siliceous film. After this, the temperature was lowered to 150° C. while maintaining the $N_2$ atmosphere and it was processed at this temperature for 60 minutes in a 2% N₂ gas atmosphere (Annealing). The relative etching rate of the siliceous film obtained was 8.5.

Comparative Example 9

A siliceous film was formed by the same manner as Comparative example 8 except for anneal processing in a 2% trimethylamine (N₂-diluted) atmosphere at 150° C. instead of anneal processing in an N₂ gas atmosphere at 150° C. The relative etching rate of the siliceous film obtained was 8.6.

From Comparative examples 8 and 9, the addition effect of amine was not recognized by anneal processing at a low temperature such as 150° C.

Example 11

About one mL of a perhydropolysilazane 20 weight-% dibutyl ether solution (Spinfil 65001 manufactured by AZ Electronic Materials Manufacturing K.K., "Spinfil" is a registered trade-mark.) was dripped on a 4-inch silicon wafer and then spin-coated on a silicon wafer at a speed of 1,000 rpm for 20 seconds by a spin coater, followed by soft baking on a hot plate at 150° C. for 3 minutes in the atmosphere. The film thickness was 600 nm. Then, it was processed with 80% water vapor (H₂O is 80% and O₂ is 20%.) at 350° C. for 60 minutes (Baking) to change perhydropolysilazane into a siliceous film. After this, it was processed in a 2% NF₃ (N₂-diluted) atmosphere at 350° C. for 60 minutes. This film was continuously annealed in an N₂ atmosphere at 850° C. The relative etching rate of the siliceous film obtained was 1.5.

Examples 12 and 13

A siliceous film was formed by the same manner as Example 11 except for processing in a 2% Br₂ (N₂-diluted) atmosphere (Example 12) or a 2% F₂ (N₂-diluted) atmosphere (Example 13) instead of processing in a 2% trimethylamine (N₂-diluted) atmosphere. The relative etching rates of the siliceous films obtained were, respectively, 1.7 and 1.4.

Comparative Example 10

A siliceous film was formed by the same manner as Example 11 except for processing in an N₂ gas atmosphere instead of processing in a 2% NF₃ (N₂-diluted) atmosphere at 350° C. The relative etching rate of the siliceous film obtained was 2.6.

Comparative examples 11 and 12

A siliceous film was formed by the same manner as Example 11 except for processing in a 2% CF₄ (N₂-diluted) atmosphere (Comparative example 11) or a 2% HF (N₂-diluted) atmosphere (Comparative example 12) instead of processing in a 2% NF₃ (N₂-diluted) atmosphere. The relative etching rates of the siliceous films obtained were both 2.7.

From Examples 11 to 13 and Comparative example 10, it is understood that the etching rate becomes late even when NF₃, Br₂, and 2% F₂ were used at the time of annealing.

In addition, the halogen binding energy of halogen compounds used Examples 11 to 13 are as follows. N—F is 57 kcal/mol, Br—Br is 46 kcal/mol, and F—F is 38 kcal/mol. In contrast, the halogen binding energy of halogen compounds used in Comparative examples 11 and 12 are that H—F is 135 kcal/mol and C—F is 117 kcal/mol. From these, it is understood that the advantageous effect of the present invention is obtained when the halogen binding energy is 60 kcal/mol or less.

Example 14

A siliceous film was formed by the same manner as Example 1 except for processing in a N₂ gas atmosphere at 850° C. for 60 minutes instead of processing in a N₂ gas atmosphere at 700° C. for 60 minutes. The relative etching rate of the siliceous film obtained was 1.6.

Comparative Example 13

A siliceous film was formed by the same manner as Comparative example 1 except for processing in a N₂ gas atmosphere at 850° C. for 60 minutes instead of processing in a N₂ gas atmosphere at 700° C. for 60 minutes. The relative etching rate of the siliceous film obtained was 2.6.

Further, film properties of a siliceous film prepared Example 14 and a siliceous film prepared by Comparative example 13 were measured. The results are shown in Table 2 below.

TABLE 2

| | Shrinkage percentage* (%) | Stress** (MPa) | Electric characteristics | | |
|---|---|---|---|---|---|
| | | | Dielectric constant | Vfb (V) | Vbd (MV/cm) |
| Example 14 | 18.3 | −26 | 3.61 | −23.5 | 6.4 |
| Comparative example 13 | 17.7 | 43 | 3.75 | −5.37 | 5.9 |

*Shrinkage percentage in the thickness direction of the film thickness after annealing to the film thickness after soft bake.
**A value in plus shows a tensile strength and a value in minus shows a compressive force.
Vfb: A flat band voltage.
Vbd: A withstand voltage (Break Down Voltage).

From Table 2, it is understood that a more dense silica film is able to be formed by annealing in a trimethylamine-containing atmosphere because the value of the withstand voltage of Example 14 is higher than that of Comparative example 13.

The invention claimed is:
1. A method for forming a siliceous film-comprising the steps of
(a) forming a siliceous film on a substrate by applying a polysilazane solution on the substrate and curing it in an oxidation atmosphere; and
(b) heating and annealing the siliceous film in an inert atmosphere containing a halogen-containing compound having the binding energy of a halogen atom of 60 kcal/mol or less,
wherein the halogen-containing compound having the binding energy of a halogen atom of 60 kcal/mol or less is Br₂, F₂ or NF₃ and the polysilazane is perhydropolysilazanes and the cure is performed at 200 to 500° C. in a water vapor atmosphere.
2. A method for forming a trench isolation structure, wherein a substrate has a groove for forming a trench isolation structure and the groove is buried and sealed by the method for forming a siliceous film according to claim 1.
3. A method for forming a siliceous film comprising the steps of

(a) forming a siliceous film on a substrate by applying a polysilazane solution on the substrate and curing it in an oxidation atmosphere; and (b) heating and annealing the siliceous film in an inert atmosphere containing a halogen-containing compound having the binding energy of a halogen atom of 60 kcal/mol or less, wherein the halogen-containing compound having the binding energy of a halogen atom of 60 kcal/mol or less is $Br_2$, $F_2$ or $NF_3$, the annealing is performed at 200 to 500 ° C. in a dry atmosphere, the polysilazane is perhydropolysilazanes and the cure is performed at 200 to 500° C. in a water vapor atmosphere.

4. A method for forming a trench isolation structure, wherein a substrate has a groove for forming a trench isolation structure and the groove is buried and sealed by the method for forming a siliceous film according to claim 3.

* * * * *